(12) United States Patent
Le et al.

(10) Patent No.: US 12,183,831 B2
(45) Date of Patent: Dec. 31, 2024

(54) SELF-ALIGNED CONTACTS FOR THIN FILM TRANSISTORS

(71) Applicant: Intel Corporation, Santa Clara, CA (US)

(72) Inventors: Van H. Le, Beaverton, OR (US); Abhishek A. Sharma, Hillsboro, OR (US); Benjamin Chu-Kung, Boise, ID (US); Gilbert Dewey, Hillsboro, OR (US); Ravi Pillarisetty, Portland, OR (US); Miriam R. Reshotko, Portland, OR (US); Shriram Shivaraman, Hillsboro, OR (US); Li Huey Tan, Hillsboro, OR (US); Tristan A. Tronic, Aloha, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 79 days.

(21) Appl. No.: 16/638,301

(22) PCT Filed: Sep. 29, 2017

(86) PCT No.: PCT/US2017/054368
§ 371 (c)(1),
(2) Date: Feb. 11, 2020

(87) PCT Pub. No.: WO2019/066912
PCT Pub. Date: Apr. 4, 2019

(65) Prior Publication Data
US 2020/0227568 A1    Jul. 16, 2020

(51) Int. Cl.
*H01L 29/786*    (2006.01)
*H01L 27/12*     (2006.01)
(Continued)

(52) U.S. Cl.
CPC ...... *H01L 29/78696* (2013.01); *H01L 27/124* (2013.01); *H01L 29/401* (2013.01);
(Continued)

(58) Field of Classification Search
CPC .................................................. H01L 29/7869
See application file for complete search history.

(56) References Cited

U.S. PATENT DOCUMENTS 9,559,215 B1 *   1/2017  Ahmed ................. H01L 27/127
2005/0056838 A1  3/2005  Tsai et al.
(Continued)

FOREIGN PATENT DOCUMENTS

CN    105892221    *  8/2016
EP    1422766        5/2004

OTHER PUBLICATIONS

Kaneko, K. "A Novel BEOL Transistor (BETr) with InGaZnO Embedded in Cu-Interconnects for On-Chip High Voltage I/Os in Standard CMOS LSIs" 2011 Symp. on VLSI Technol. Dig. of Tech. Pap. Aug. 18, 2011 pp. 120-121 (Year: 2011).*

(Continued)

*Primary Examiner* — Grant S Withers
(74) *Attorney, Agent, or Firm* — Schwabe, Williamson & Wyatt P.C.

(57) ABSTRACT

Embodiments herein describe techniques for a semiconductor device, which may include a substrate, and a U-shaped channel above the substrate. The U-shaped channel may include a channel bottom, a first channel wall and a second channel wall parallel to each other, a source area, and a drain area. A gate dielectric layer may be above the substrate and in contact with the channel bottom. A gate electrode may be above the substrate and in contact with the gate dielectric layer. A source electrode may be coupled to the source area, (Continued)

and a drain electrode may be coupled to the drain area. Other embodiments may be described and/or claimed.

16 Claims, 14 Drawing Sheets

(51) Int. Cl.
  *H01L 29/40* (2006.01)
  *H01L 29/417* (2006.01)
(52) U.S. Cl.
  CPC .. *H01L 29/41733* (2013.01); *H01L 29/78663* (2013.01); *H01L 29/7869* (2013.01)

(56) References Cited

U.S. PATENT DOCUMENTS

| | | | |
|---|---|---|---|
| 2009/0127551 A1* | 5/2009 | Imai | H01L 29/78693 |
| | | | 257/43 |
| 2010/0038641 A1 | 2/2010 | Imai | |
| 2012/0032180 A1 | 2/2012 | Nagai et al. | |
| 2013/0228779 A1 | 9/2013 | Lan et al. | |
| 2016/0204135 A1* | 7/2016 | Kim | H01L 27/127 |
| | | | 349/46 |
| 2020/0012132 A1* | 1/2020 | Inoue | H01L 29/66969 |

OTHER PUBLICATIONS

Seo, J-S. "Solution-Processed Flexible Fluorine-doped Indium Zinc Oxide Thin-Film Transistors Fabricated on Plastic Film at Low Temperature" Scientific Reports Jun. 27, 2013 pp. 1-9 (Year: 2013).*

Li, X. "High-Speed Dual-Gate a-IGZO TFT-Based Circuits With Top-Gate Offset Structure" IEEE Electron Device Letters, vol. 35, No. 4 Feb. 24, 2014 pp. 461-463 (Year: 2014).*

International Preliminary Report on Patentability for International Patent Application No. PCT/US2017/054368 mailed Apr. 9, 2020, 10 pgs.

International Search Report and Written Opinion for International Patent Application No. PCT/US2017/054368 mailed Jun. 28, 2018, 13 pgs.

* cited by examiner

SELF-ALIGNED CONTACTS FOR THIN FILM TRANSISTORS

CROSS-REFERENCE TO RELATED APPLICATION

This patent application is a U.S. National Phase Application under 35 U.S.C. § 371 of International Application No. PCT/US2017/054368, filed Sep. 29, 2017, entitled "SELF-ALIGNED CONTACTS FOR THIN FILM TRANSISTORS," which designates the United States of America, the entire disclosure of which is hereby incorporated by reference in its entirety and for all purposes.

FIELD

Embodiments of the present disclosure generally relate to the field of integrated circuits, and more particularly, to transistors.

BACKGROUND

A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs vertically in the backend, while leaving the silicon substrate areas for high-speed transistors. TFTs hold great potential for large area and flexible electronics, e.g., displays. Other applications of TFTs may include memory arrays.

TFTs may be fabricated by lithography technology based on design patterns of various components of the TFTs. With the continued scaling of device dimensions, it may be increasingly difficult to pattern the components of the TFTs. Furthermore, there may be variations among multiple TFTs caused by the edge roughness and variations of the patterns. The variations of the multiple TFTs may adversely affect the on and off currents of the TFTs.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
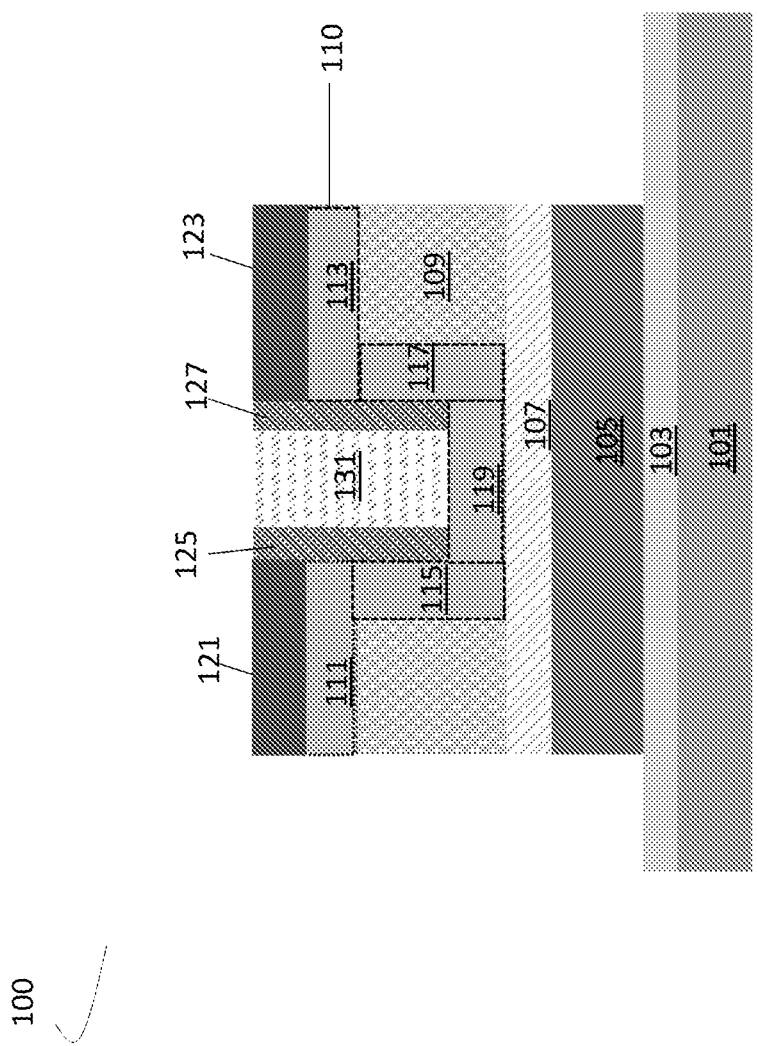
FIG. 1 schematically illustrates a diagram of a thin-film transistor (TFT) having a gate electrode at bottom and a U-shaped channel above the gate electrode, in accordance with some embodiments.

Thin-film transistors (TFTs) may be useful for many applications, e.g., large area displays, memory arrays, and other applications. A TFT may be configured into different structures based on positions of the electrodes: gate electrode at top, gate electrode at bottom, double gate electrodes, and more. TFTs may be fabricated through multiple lithography operations. Previous techniques may not use self-aligned patterning for the TFTs, and may introduce more errors and variations in the fabrication process. Embodiments herein may use a U-shaped channel to facilitate the formation of self-aligned source electrode and drain electrode above the U-shaped channel. Embodiments may include TFTs in various structures, e.g., gate electrode at top, gate electrode at bottom, double gate electrodes. TFTs so formed may have reduced variations among multiple TFTs, and may have improved performance at scaled dimensions.

Embodiments herein may present a semiconductor device including a substrate and a U-shaped channel above the substrate. The U-shaped channel may include a channel bottom, a first channel wall and a second channel wall parallel to each other, a source area, and a drain area. The first channel wall may intersect with the channel bottom at a first end and intersect with the source area at a second end. Similarly, the second channel wall may intersect with the channel bottom at a first end and intersect with the drain area at a second end. A gate dielectric layer may be above the substrate and in contact with the channel bottom. A gate electrode may be above the substrate and in contact with the gate dielectric layer. A source electrode may be coupled to the source area, and a drain electrode may be coupled to the drain area.

Embodiments herein may present a computing device, which may include a processor and a memory device coupled to the processor. The processor or the memory device may include a transistor. The transistor may include a U-shaped channel above a substrate. The U-shaped channel may include a channel bottom, a first channel wall and a second channel wall parallel to each other, a source area, and a drain area. The first channel wall may intersect with the channel bottom at a first end and intersect with the source area at a second end. The second channel wall may intersect with the channel bottom at a first end and intersect with the drain area at a second end. A gate dielectric layer may be in contact with the channel bottom. A gate electrode may be in contact with the gate dielectric layer. A source electrode may be coupled to the source area, and a drain electrode coupled to the drain area.

In embodiments, a method for forming a semiconductor device may include: forming a U-shaped channel above a substrate. The U-shaped channel may include a channel bottom, a first channel wall and a second channel wall parallel to each other, a source area, and a drain area. The first channel wall may intersect with the channel bottom at a first end and intersect with the source area at a second end. The second channel wall may intersect with the channel bottom at a first end and intersect with the drain area at a second end. The method may further include forming a spacer conformally covering the first channel wall, the second channel wall, and the channel bottom; forming a dummy oxide within a void next to the spacer; removing a part of the source area and a part of the drain area aligned with the dummy oxide and the spacer; forming a source electrode next to the source area, and a drain electrode next to the drain area.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates a diagram of a TFT 100 having a gate electrode 105 at bottom and a U-shaped channel 110 above the gate electrode 105, in accordance with some embodiments. For clarity, features of the TFT 100, the gate electrode 105, and the U-shaped channel 110, may be described below as examples for understanding an example TFT, a gate electrode, and/or a U-shaped channel. It is to be understood that there may be more or fewer components within a TFT, a gate electrode, and/or a U-shaped channel. Further, it is to be understood that one or more of the components within a TFT, a gate electrode, and/or a U-shaped channel, may include additional and/or varying features from the description below, and may include any device that one having ordinary skill in the art would consider and/or refer to as a TFT, a gate electrode, and/or a U-shaped channel.

In embodiments, the TFT 100 may include the substrate 101, and an ILD layer 103 above the substrate 101. The gate electrode 105 may be above the ILD layer 103. A gate dielectric layer 107 may be above the gate electrode 105. The gate electrode 105 may be above the substrate 101 and in contact with the gate dielectric layer 107. The U-shaped channel 110 may be above the gate dielectric layer 107 and the gate electrode 105. The U-shaped channel 110 may be surrounded by a dielectric layer 109 above the gate dielectric layer 107.

The U-shaped channel 110 may include a source area 111, and a drain area 113, a first channel wall 115 and a second channel wall 117 parallel to each other, and a channel bottom 119. The first channel wall 115 may intersect with the channel bottom 119 at a first end and may intersect with the source area 111 at a second end. Similarly, the second channel wall 117 may intersect with the channel bottom 119 at a first end and may intersect with the drain area 113 at a second end. The gate electrode 105 may be a bottom gate electrode between the substrate 101 and the channel bottom 119. The gate dielectric layer 107 may be between the gate electrode 105 and the channel bottom 119, and further in contact with the channel bottom 119.

A source electrode 121 may be coupled to the source area 111, and a drain electrode 123 may be coupled to the drain area 113. A first spacer 125 may be next to the first channel wall 115, the source area 111, and the source electrode 121. A second spacer 127 may be next to the second channel wall 117, the drain area 113, and the drain electrode 123. A passivation layer 131 may be between the first channel wall 115 and the second channel wall 117, next to the first spacer 125 and the second spacer 127.

In embodiments, the substrate 101 may be a silicon substrate, a glass substrate, such as soda lime glass or borosilicate glass, a metal substrate, a plastic substrate, or another suitable substrate. Other dielectric layer or other devices may be formed on the substrate 101, not shown for clarity.

In embodiments, the ILD layer 103, or the dielectric layer 109, may include a silicon oxide (SiO) film, a silicon nitride (SiN) film, $O_3$-tetraethylorthosilicate (TEOS), $O_3$-hexamethyldisiloxane (HMDS), plasma-TEOS oxide layer, or other suitable materials.

In embodiments, the gate electrode 105, the source electrode 121, and the drain electrode 123, may be formed as a single layer or a stacked layer using one or more conductive films including a conductive material. For example, the gate electrode 105, the source electrode 121, and the drain electrode 123, may include gold (Au), platinum (Pt), ruthenium (Ru), iridium (Ir), titanium (Ti), aluminum (Al), molybdenum (Mo), gold (Au), copper (Cu), tantalum (Ta), tungsten (W), nickel (Ni), chromium (Cr), or an alloy of Ti, Mo, Au, Pt, Al Ni, Cu, Cr, TiAlN, HfAlN, or InAlO. For example, the gate electrode 105, the source electrode 121, the drain electrode 123, may include tantalum nitride (TaN), titanium nitride (TiN), iridium-tantalum alloy (Ir—Ta), indium-tin oxide (ITO), the like, and/or a combination thereof.

In embodiments, the gate dielectric layer 107 may include silicon and oxygen, silicon and nitrogen, yttrium and oxygen, silicon, oxygen, and nitrogen, aluminum and oxygen, hafnium and oxygen, tantalum and oxygen, or titanium and oxygen. For example, the gate dielectric layer 107 may include silicon oxide ($SiO_2$), silicon nitride ($SiN_x$), yttrium oxide ($Y_2O_5$), silicon oxynitride (SiON), aluminum oxide ($Al_2O_3$), hafnium(IV) oxide ($HfO_2$), tantalum oxide ($Ta_2O_5$), titanium dioxide ($TiO_2$), or other materials.

In embodiments, the channel layer 110, including the source area 111, the drain area 113, the first channel wall 115, the second channel wall 117, and the channel bottom 119, may include a material comprising amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC). The channel layer 110 may have a thickness in a range of about 10 nm to about 100 nm. The dimensions of the source area 111, the drain area 113, the first channel wall 115, the second channel wall 117, and the channel bottom 119, are for illustrations only and are not limiting. For some other embodiments, the source area 111, the drain area 113, the first channel wall 115, the second channel wall 117, and the channel bottom 119 may have different dimensions. For example, in some embodiments, the source area 111 and the first channel wall 115 may have a same width relative to the surface of the gate electrode 105. Additionally and alternatively, the source area 111 may be a part of the first channel wall 115, and the drain area 113 may be a part of the second channel wall 117.

In embodiments, the first spacer 125 may be next to first channel wall 115, and the second spacer 127 may be next to the second channel wall 117. The first spacer 125 and the second spacer 127 may serve as an alignment for the source electrode 121 and the drain electrode 123. The first spacer 125 and the second spacer 127 may include a dielectric material, similar to a dielectric material for the ILD layer 103, or the dielectric layer 109.

In embodiments, the passivation layer 131 may include one or more materials capable of providing passivation, such as physical, chemical and/or electrical insulation, isolation, stability and/or separation between two or more other layers, e.g., the first spacer 125 and the second spacer 127, the source electrode 121 and the drain electrode 123. For example, the passivation layer 131 may include a dielectric material, such as a wide-bandgap dielectric material including oxides and/or nitrides of the following materials: silicon, germanium, aluminum, gallium, zirconium, tantalum, such as $SiO_x$, $SiN_x$, $SiO_xN_y$, $GeO_x$, $AlO_x$, $GaO_x$, $SbO_x$, $ZrO_x$, $HfO_x$, $TaO_x$, $SiO_xC_y$, $YO_x$, $VO_x$, $MgO_x$, $MgF_x$, $CaO_x$, $CaF_x$, $BaO_x$, $BaF_x$, $SrO_x$, and/or $SrF_x$.

Figure 2:
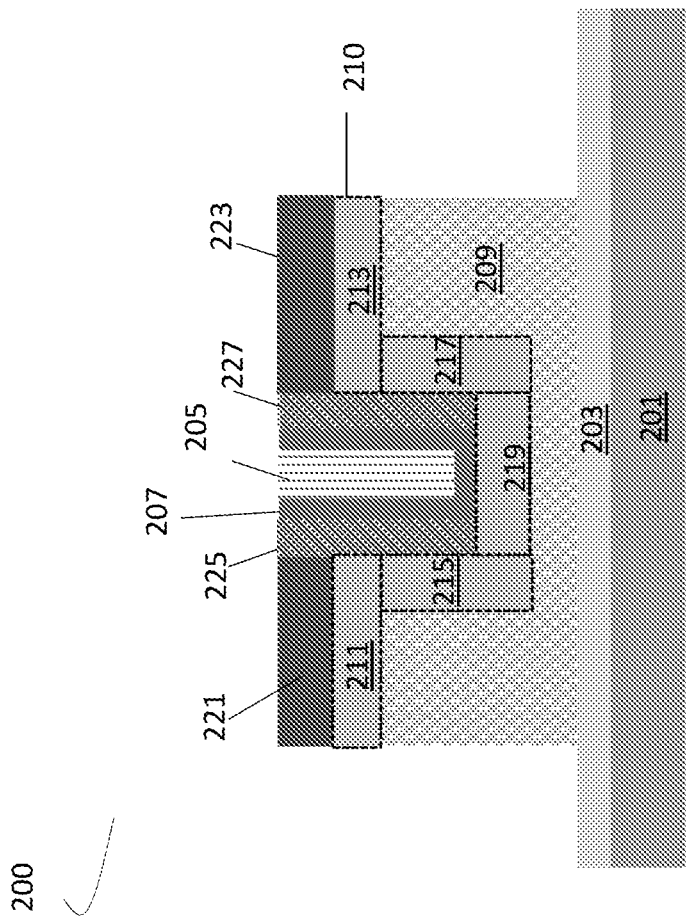
FIG. 2 schematically illustrates a diagram of another TFT having a gate electrode at top above a channel bottom, and between a first channel wall and a second channel wall of a U-shaped channel, in accordance with some embodiments.

FIG. 2 schematically illustrates a diagram of another TFT 200 having a gate electrode 205 at top above a channel bottom 219, and between a first channel wall 215 and a second channel wall 217 of a U-shaped channel 210, in accordance with some embodiments. In embodiments, the TFT 200 may be similar to the TFT 100, while the channel 210 and the gate electrode 205 may be similar to the channel 110 and the gate electrode 105, shown in FIG. 1. Various other layers in the TFT 200 may be similar to corresponding layers in the TFT 100 in FIG. 1. The TFT 100 may have the gate electrode 105 as a bottom gate electrode between the substrate 101 and the channel bottom 119. On the other hand, the TFT 200 may have the gate electrode 205 as a top gate electrode above the channel bottom 219.

In embodiments, the TFT 200 may include the substrate 201, and an ILD layer 203 above the substrate 201. The U-shaped channel 210 may be surrounded by a dielectric layer 209 above the ILD layer 203. The U-shaped channel 210 may include a source area 211, a drain area 213, the first channel wall 215 and the second channel wall 217 parallel to each other, and the channel bottom 219. The first channel wall 215 may intersect with the channel bottom 219 at a first end and may intersect with the source area 211 at a second end. Similarly, the second channel wall 217 may intersect with the channel bottom 219 at a first end and may intersect with the drain area 213 at a second end. A source electrode 221 may be coupled to the source area 211, and a drain electrode 223 may be coupled to the drain area 213. A first spacer 225 may be next to the first channel wall 215, the source area 211, and the source electrode 221. A second spacer 227 may be next to the second channel wall 217, the drain area 213, and the drain electrode 223.

A gate dielectric layer 207 may conformally cover and in contact with the channel bottom 219, the first spacer 225, and the second spacer 227. The gate electrode 205 may be within a void formed by the gate dielectric layer 207. The gate dielectric layer 207 may be between the gate electrode 205 and the channel bottom 219, and further in contact with the channel bottom 219. The gate electrode 205 may be a top gate electrode above the channel bottom 219, and between the first channel wall 215 and the second channel wall 217. The gate dielectric layer 207 may be above the channel bottom 219, separating the first channel wall 215 and the second channel 217 from the gate electrode 205.

Figure 3:
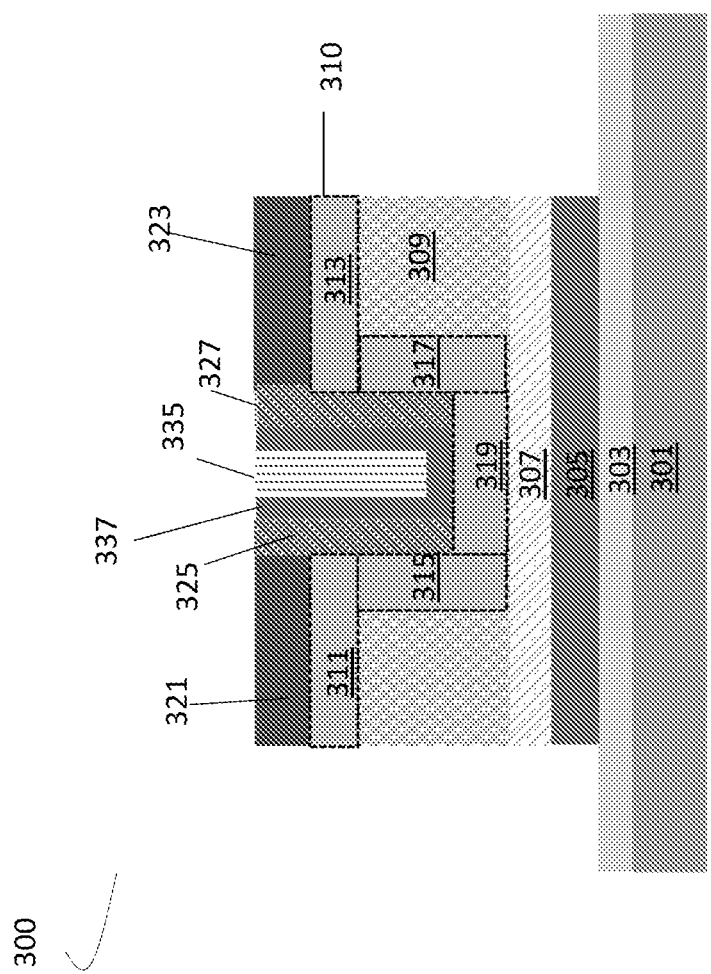
FIG. 3 schematically illustrates a diagram of another TFT having a gate electrode at top above a channel bottom, and between a first channel wall and a second channel wall of a U-shaped channel, and a gate electrode at bottom below the channel bottom, in accordance with some embodiments.

FIG. 3 schematically illustrates a diagram of another TFT 300 having a gate electrode 335 at top above a channel bottom 319, and between a first channel wall 315 and a second channel wall 317 of a U-shaped channel 310, and a gate electrode 305 at bottom below the channel bottom 319, in accordance with some embodiments. In embodiments, the TFT 300 may be similar to the TFT 100 or the TFT 200, while the channel 310 may be similar to the channel 110 in FIG. 1 and the channel 210 in FIG. 2. In addition, the gate electrode 335 may be similar to the gate electrode 205 in FIG. 2, while the gate electrode 305 may be similar to the gate electrode 105 in FIG. 1. Various other layers in the TFT 300 may be similar to corresponding layers in the TFT 100 in FIG. 1, or the corresponding layers in the TFT 200 in FIG. 2. The TFT 300 may include the gate electrode 305 as a bottom gate electrode between the substrate 301 and the channel bottom 319, and further include the gate electrode 335 as a top gate electrode above the channel bottom 319.

In embodiments, the TFT 300 may include the substrate 301, and an ILD layer 303 above the substrate 301. The gate electrode 305 may be above the ILD layer 303. A gate dielectric layer 307 may be above the gate electrode 305. The gate electrode 305 may be above the substrate 301 and in contact with the gate dielectric layer 307. The U-shaped channel 310 may be above the gate dielectric layer 307 and the gate electrode 305. The U-shaped channel 310 may be surrounded by a dielectric layer 309 above the gate dielectric layer 307.

The U-shaped channel 310 may include a source area 311, a drain area 313, the first channel wall 315 and the second channel wall 317 parallel to each other, and the channel bottom 319. The first channel wall 315 may intersect with the channel bottom 319 at a first end and may intersect with the source area 311 at a second end. Similarly, the second channel wall 317 may intersect with the channel bottom 319 at a first end and may intersect with the drain area 313 at a second end. A source electrode 321 may be coupled to the source area 311, and a drain electrode 323 may be coupled to the drain area 313. A first spacer 325 may be next to the first channel wall 315, the source area 311, and the source electrode 321. A second spacer 327 may be next to the second channel wall 317, the drain area 313, and the drain electrode 323.

In addition, a gate dielectric layer 337 may conformally cover and in contact with the channel bottom 319, the first spacer 325, and the second spacer 327. The gate electrode 335 may be within a void formed by the gate dielectric layer 337. The gate dielectric layer 337 may be between the gate electrode 335 and the channel bottom 319, and further in contact with the channel bottom 319. The gate electrode 335 may be a top gate electrode above the channel bottom 319, and between the first channel wall 315 and the second channel wall 317. The gate dielectric layer 337 may be above the channel bottom 319, separating the first channel wall 315 and the second channel 317 from the gate electrode 335.

Figure 4:
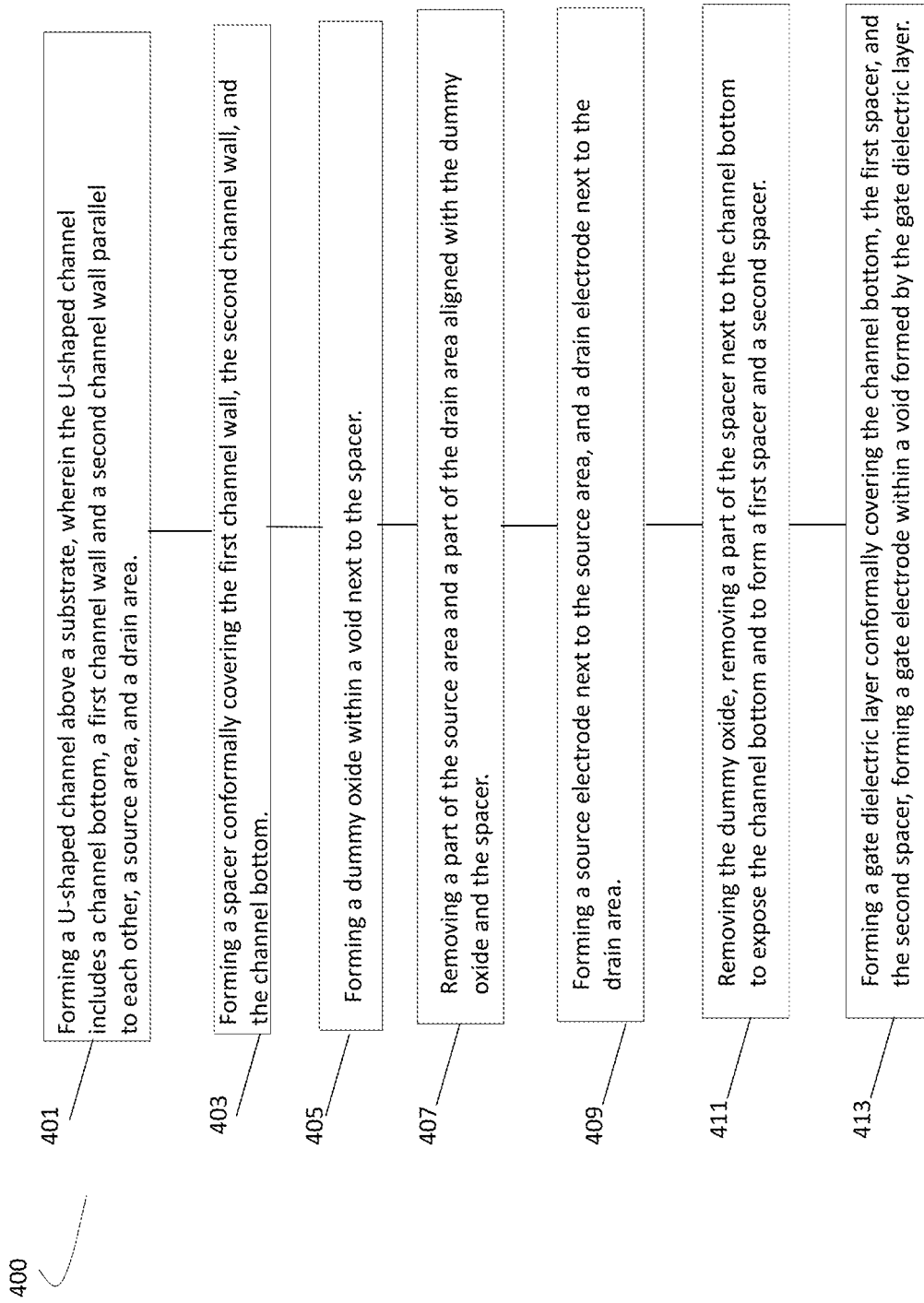
FIG. 4 illustrates a process for forming a TFT having a U-shaped channel, in accordance with some embodiments.

FIG. 4 illustrates a process 400 for forming a TFT having a U-shaped channel, in accordance with some embodiments. In embodiments, the process 400 may be applied to form the TFT 100 in FIG. 1, the TFT 200 in FIG. 2, or the TFT 300 in FIG. 3. More details of various stages of an application of the process 400 to form a TFT 500 having a U-shaped channel 510, may be shown in FIGS. 5-11.

Figure 5:
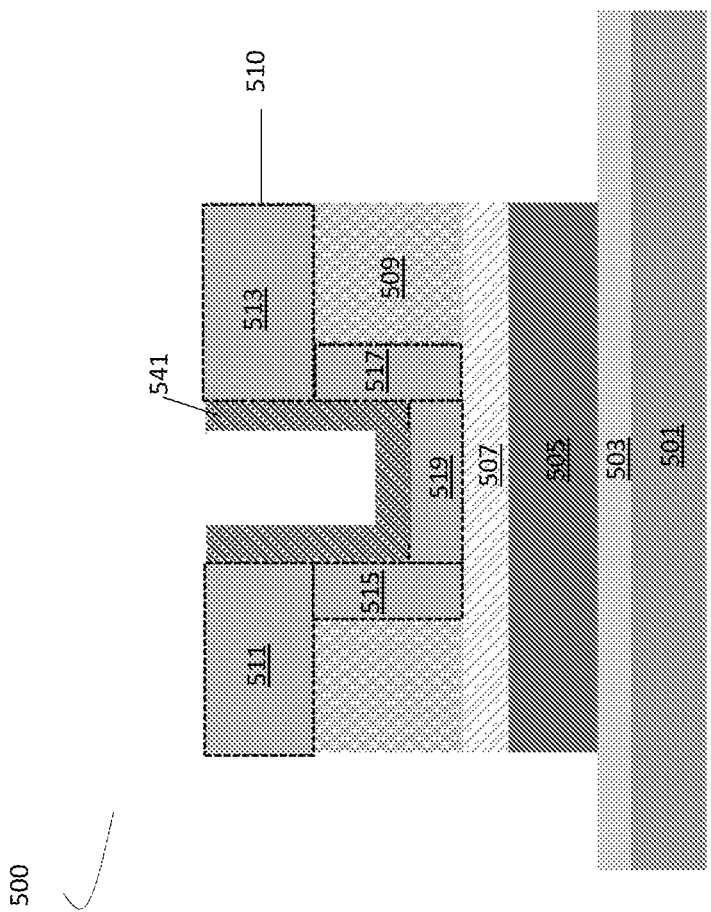
FIGS. 5-11 illustrate various stages of a process for forming a TFT having a U-shaped channel, in accordance with some embodiments.

At block 401, the process 400 may include forming a U-shaped channel above a substrate, wherein the U-shaped channel includes a channel bottom, a first channel wall and a second channel wall parallel to each other, a source area, and a drain area. In embodiments, the first channel wall may intersect with the channel bottom at a first end and intersect with the source area at a second end. Similarly, the second channel wall may intersect with the channel bottom at a first end and intersect with the drain area at a second end. For example, as shown in FIG. 5, the process 400 may be applied to form the U-shaped channel 510. In embodiments, the U-shaped channel 510 may be formed above a substrate 501, an ILD layer 503 above the substrate 501. A gate electrode 505 may be above the ILD layer 503. A gate dielectric layer 507 may be above the gate electrode 505 and in contact with the gate electrode 505. The U-shaped channel 510 may be above the gate dielectric layer 507 and the gate electrode 505, and surrounded by a dielectric layer 509 above the gate dielectric layer 507.

The U-shaped channel 510 may include a source area 511, a drain area 513, a first channel wall 515 and a second channel wall 517 parallel to each other, and a channel bottom 519. The first channel wall 515 may intersect with the channel bottom 519 at a first end and may intersect with the source area 511 at a second end. Similarly, the second channel wall 517 may intersect with the channel bottom 519 at a first end and may intersect with the drain area 513 at a second end. The gate electrode 505 may be a bottom gate electrode between the substrate 501 and the channel bottom 519. The gate dielectric layer 507 may be between the gate electrode 505 and the channel bottom 519, and further in contact with the channel bottom 519.

At block 403, the process 400 may include forming a spacer conformally covering the first channel wall, the second channel wall, and the channel bottom. For example, as shown in FIG. 5, the process 400 may be applied to form a spacer 541, which may conformally cover the first channel wall 515, the second channel wall 517, and the channel bottom 519.

Figure 6:
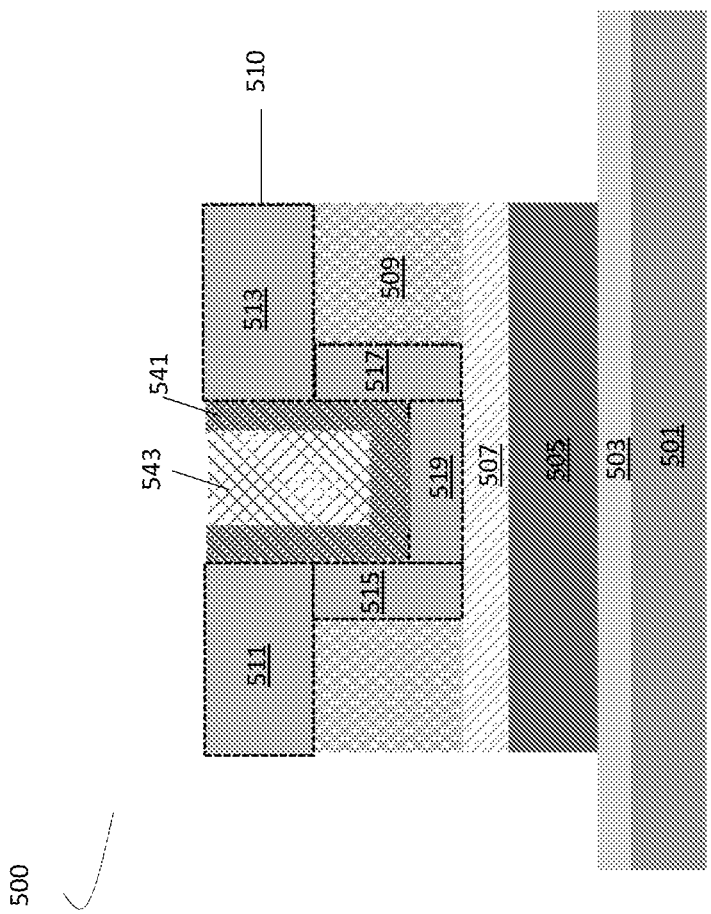

At block 405, the process 400 may include forming a dummy oxide within a void next to the spacer. For example, as shown in FIG. 6, the process 400 may be applied to form a dummy oxide 543 within a void next to the spacer 541.

Figure 7:
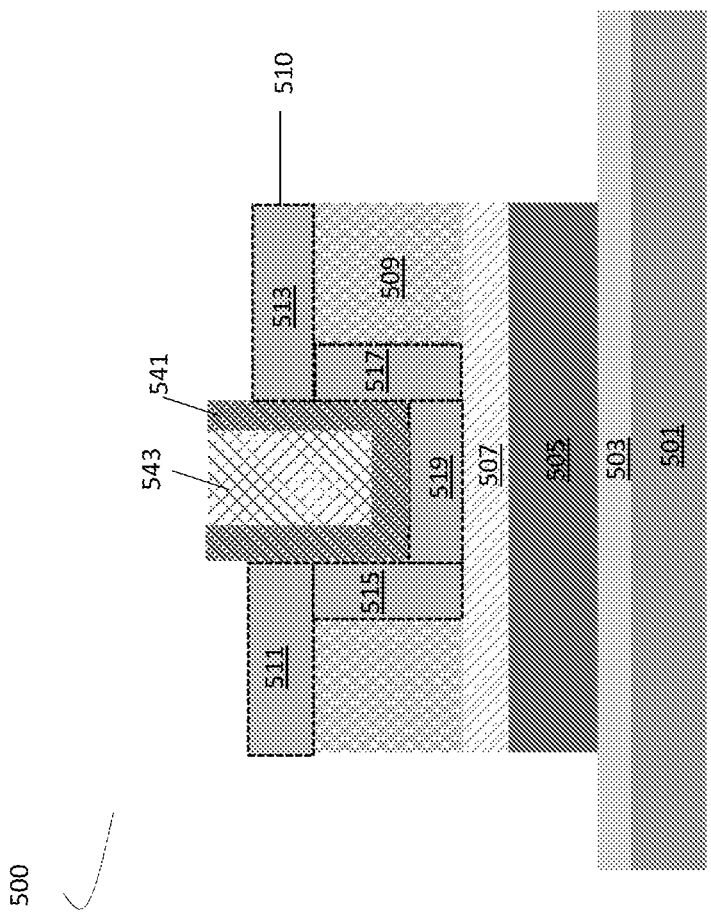

At block 407, the process 400 may include removing a part of the source area and a part of the drain area aligned with the dummy oxide and the spacer. For example, as shown in FIG. 7, the process 400 may be applied to remove a part of the source area 511 and a part of the drain area 513, aligned with the dummy oxide 543 and the spacer 541. The dummy oxide 543 and the spacer 541 may serve the function of a patterning for forming removing a part of the source area 511 and a part of the drain area 513, where a source electrode and a drain electrode may be formed.

Figure 8:
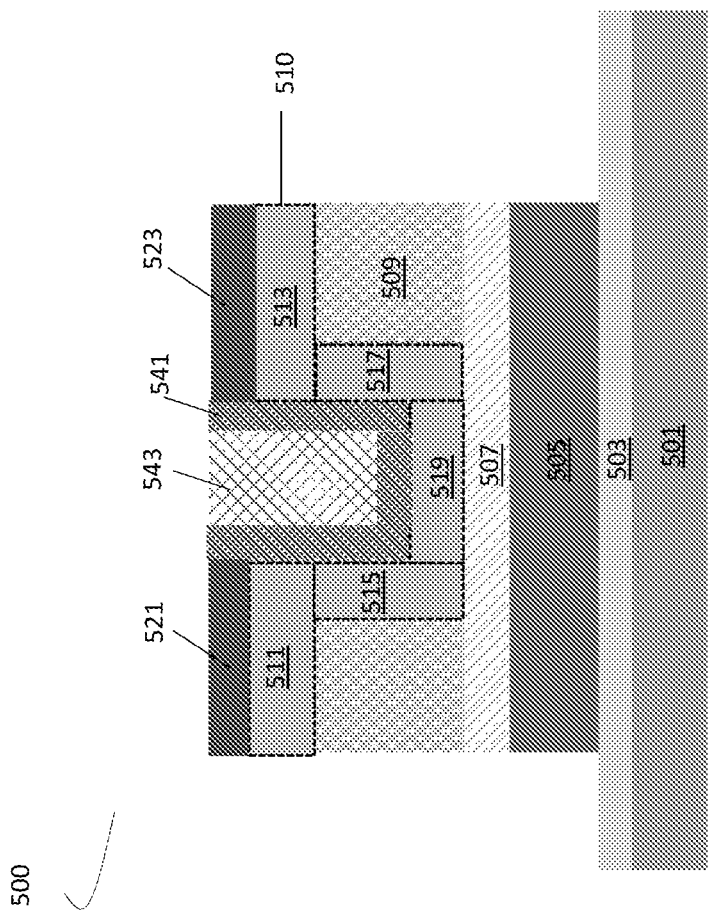

At block 409, the process 400 may include forming a source electrode next to the source area, and a drain electrode next to the drain area. For example, as shown in FIG. 8, the process 400 may be applied to form a source electrode 521 next to the source area 511, and a drain electrode 523 next to the drain area 513.

Figure 9:
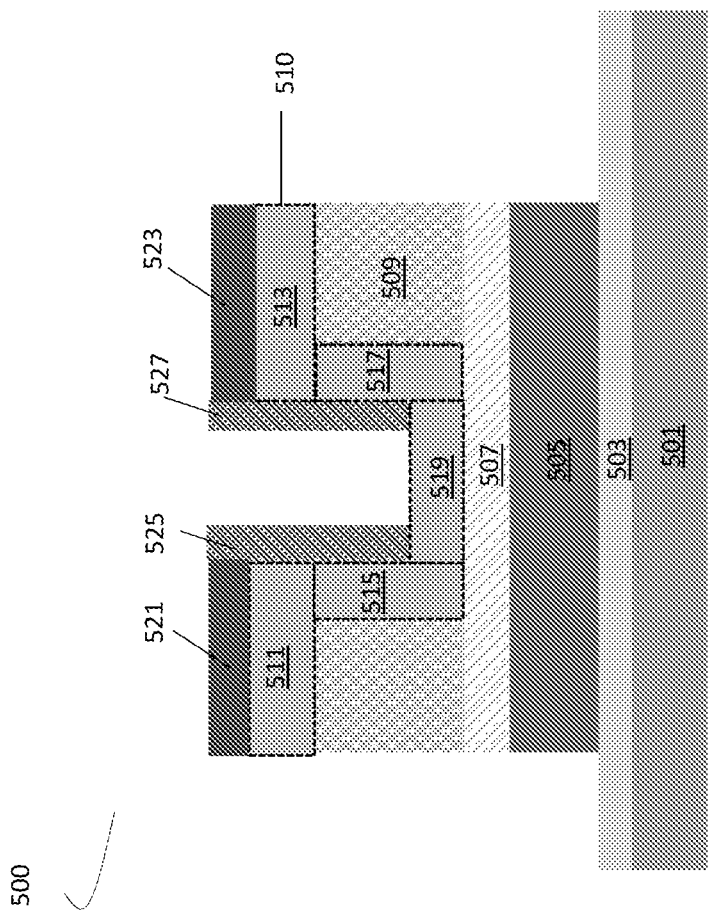

At block 411, the process 400 may include removing the dummy oxide, and removing a part of the spacer next to the channel bottom to expose the channel bottom and to form a first spacer and a second spacer. For example, as shown in FIG. 9, the process 400 may be applied to remove the dummy oxide 543, and remove a part of the spacer 541 next to the channel bottom 519 to expose the channel bottom 519 and to form a first spacer 525 and a second spacer 527.

Figure 10:
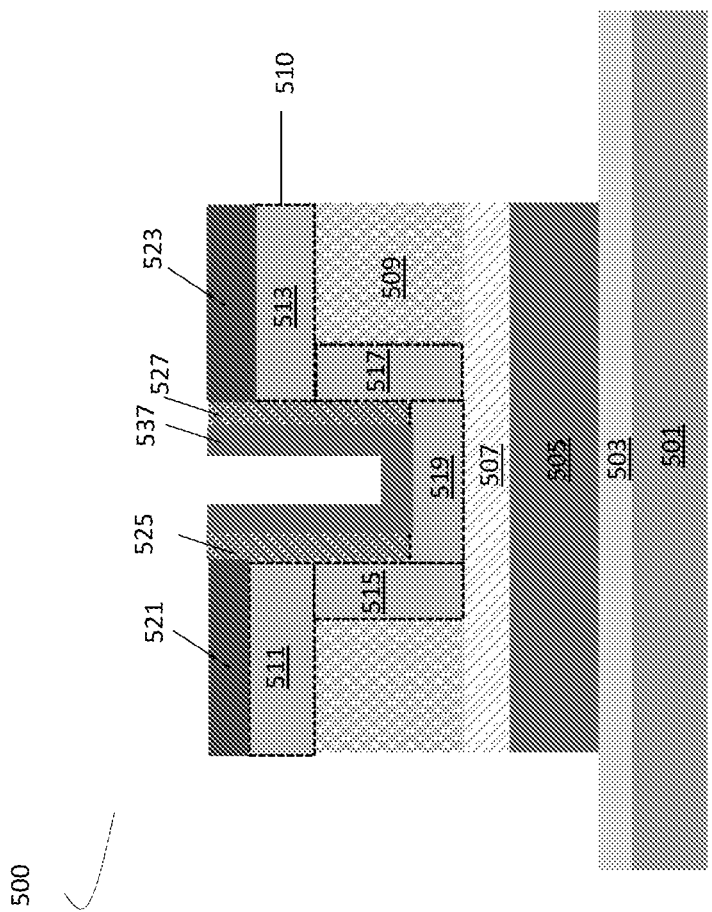
Figure 11:
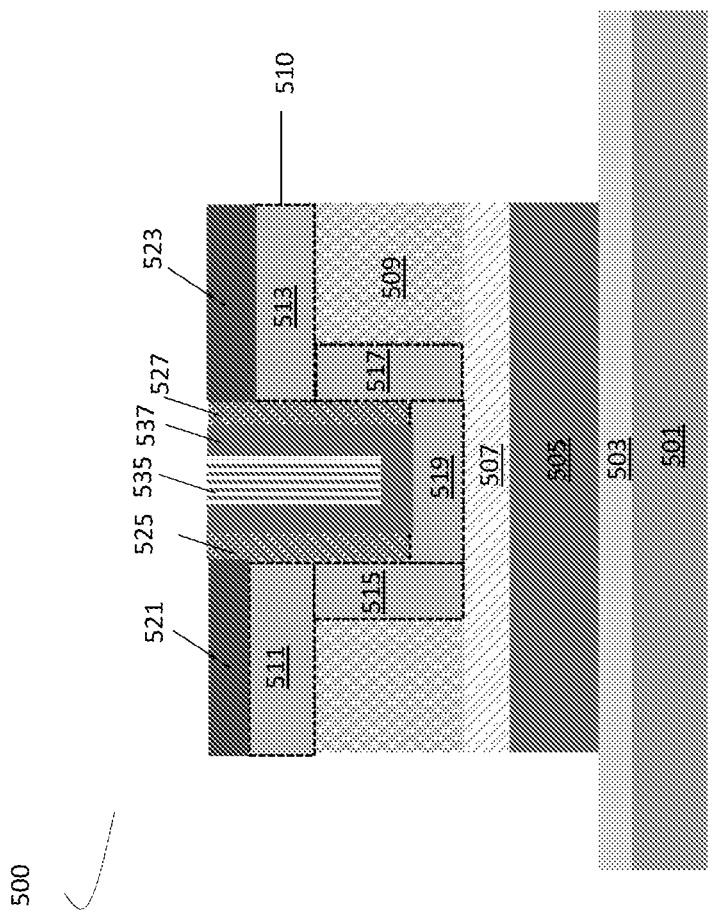

At block 413, the process 400 may include forming a gate dielectric layer conformally covering the channel bottom, the first spacer, and the second spacer, and forming a gate electrode within a void formed by the gate dielectric layer. For example, as shown in FIG. 10, the process 400 may be applied to form a gate dielectric layer 537 conformally covering the channel bottom 519, the first spacer 525, and the second spacer 527. In addition, as shown in FIG. 11, the process 400 may be applied to form a gate electrode 535 within a void formed by the gate dielectric layer 537.

In addition, the process 400 may include additional operations. For example, the process 400 may include forming a gate electrode 505 above the substrate 501, before forming the U-shaped channel 510, and forming a gate dielectric layer 507 above the gate electrode 505 before forming the U-shaped channel 510. Additionally and alternatively, instead of forming the gate dielectric layer 537 and the gate electrode 535, the process 400 may include forming a passivation layer between the first spacer 525, the second spacer 527, and in contact with the channel bottom 519.

Figure 12:
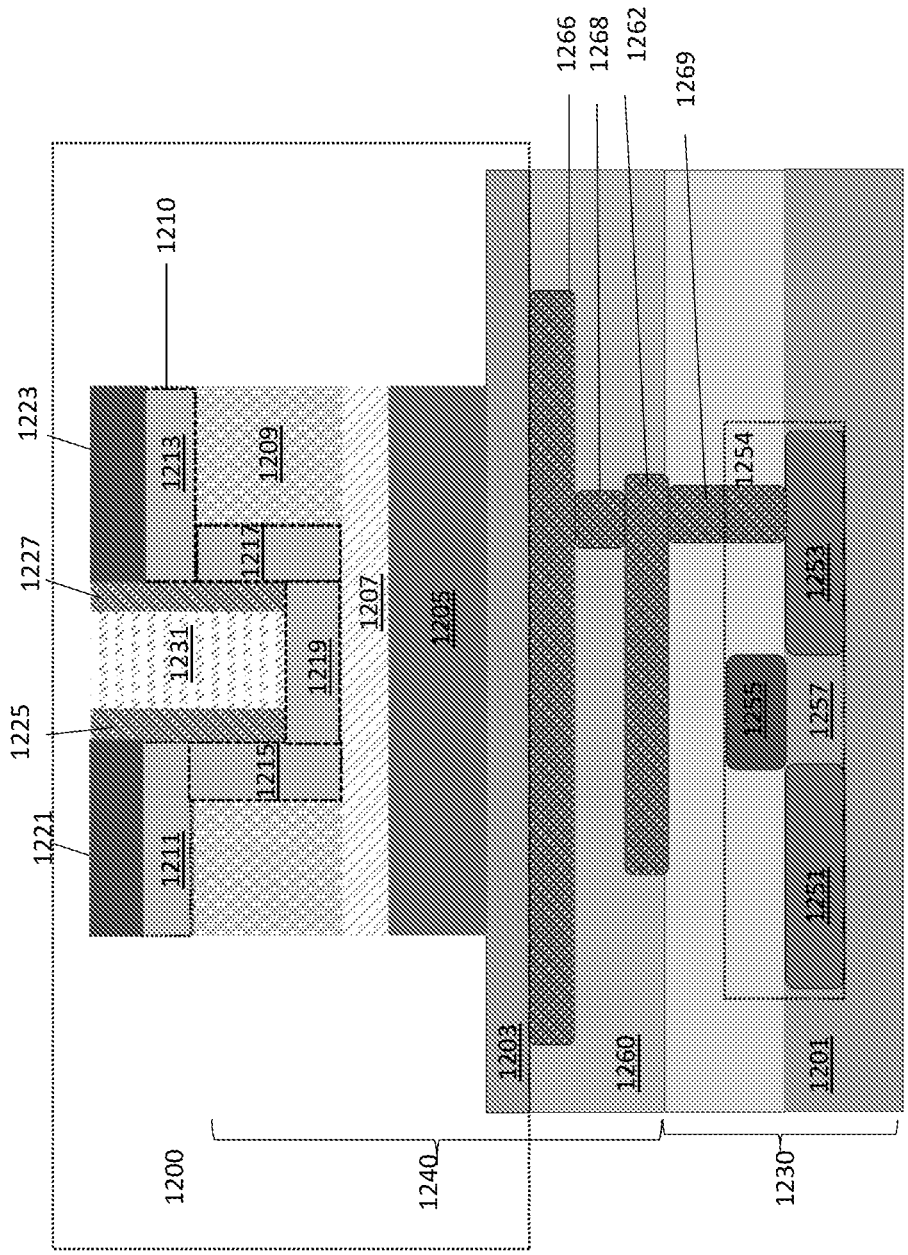
FIG. 12 schematically illustrates a diagram of a TFT having a U-shaped channel and formed in back-end-of-line (BEOL) on a substrate, in accordance with some embodiments.

FIG. 12 schematically illustrates a diagram of a TFT 1200 having a U-shaped channel 1210 and formed in back-end-of-line (BEOL) on a substrate 1201, in accordance with some embodiments. The TFT 1200 may be an example of the TFT 100 in FIG. 1, an example of the TFT 200 in FIG. 2, or an example of the TFT 300 in FIG. 3. Various layers in the TFT 1200 may be similar to corresponding layers in the TFT 100 in FIG. 1, the TFT 200 in FIG. 2, or the TFT 300 in FIG. 3.

In embodiments, the TFT 1200 may be formed on the substrate 1201. The TFT 1200 may include an ILD layer 1203 above the substrate 1201. A gate electrode 1205 may be above the ILD layer 1203. A gate dielectric layer 1207 may be above the gate electrode 1205. The gate electrode 1205 may be above the substrate 1201 and in contact with the gate dielectric layer 1207. The U-shaped channel 1210 may be above the gate dielectric layer 1207 and the gate electrode 1205. The U-shaped channel 1210 may be surrounded by a dielectric layer 1209 above the gate dielectric layer 1207.

The U-shaped channel 1210 may include a source area 1211, a drain area 1213, a first channel wall 1215 and a second channel wall 1217 parallel to each other, and a channel bottom 1219. The first channel wall 1215 may intersect with the channel bottom 1219 at a first end and may intersect with the source area 1211 at a second end. Similarly, the second channel wall 1217 may intersect with the channel bottom 1219 at a first end and may intersect with the drain area 1213 at a second end. The gate electrode 1205 may be a bottom gate electrode between the substrate 1201 and the channel bottom 1219. The gate dielectric layer 1207 may be between the gate electrode 1205 and the channel bottom 1219, and further in contact with the channel bottom 1219.

A source electrode 1221 may be coupled to the source area 1211, and a drain electrode 1223 may be coupled to the drain area 1213. A first spacer 1225 may be next to the first channel wall 1215, the source area 1211, and the source electrode 1221. A second spacer 1227 may be next to the second channel wall 1217, the drain area 1213, and the drain electrode 1223. A passivation layer 1231 may be between the first channel wall 1215 and the second channel wall 1217, next to the first spacer 1225 and the second spacer 1227.

In embodiments, the TFT 1200 may be formed at the BEOL 1240. In addition to the TFT 1200, the BEOL 1240 may further include a dielectric layer 1260, where one or more vias, e.g., a via 1268, may be connected to one or more interconnect, e.g., an interconnect 1266, and an interconnect 1262 within the dielectric layer 1260. In embodiments, the interconnect 1266 and the interconnect 1262 may be of different metal layers at the BEOL 1240. The dielectric layer 1260 is shown for example only. Although not shown by FIG. 12, in various embodiments there may be multiple dielectric layers included in the BEOL 1240.

In embodiments, the BEOL 1240 may be formed on the front-end-of-line (FEOL) 1230. The FEOL 1230 may include the substrate 1201. In addition, the FEOL 1230 may include other devices, e.g., a transistor 1254. In embodiments, the transistor 1254 may be a FEOL transistor, including a source 1251, a drain 1253, and a gate 1255, with a channel 1257 between the source 1251 and the drain 1253 under the gate 1255. Furthermore, the transistor 1254 may be coupled to interconnects, e.g., the interconnect 1262, through a via 1269.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

Figure 13:
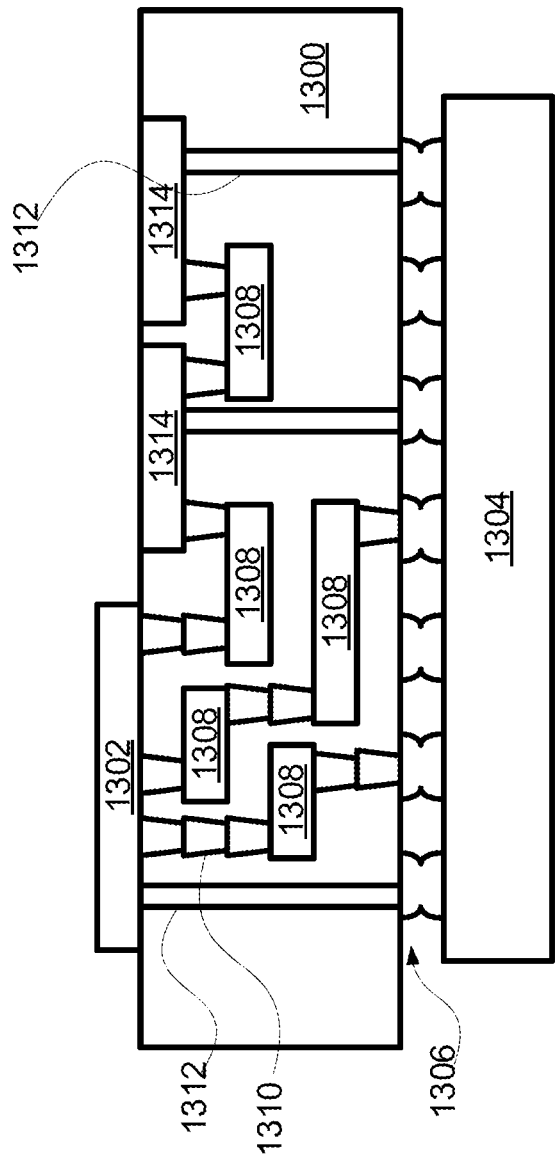
FIG. 13 schematically illustrates an interposer implementing one or more embodiments of the disclosure, in accordance with some embodiments.

FIG. 13 illustrates an interposer 1300 that includes one or more embodiments of the disclosure. The interposer 1300 is an intervening substrate used to bridge a first substrate 1302 to a second substrate 1304. The first substrate 1302 may be, for instance, a substrate support for a TFT, e.g., the TFT 100 shown in FIG. 1, the TFT 200 shown in FIG. 2, the TFT 300 shown in FIG. 3, the TFT 1200 shown in FIG. 12, or a TFT formed according to the process 400 shown in FIG. 4. The second substrate 1304 may be, for instance, a memory module, a computer motherboard, or another integrated circuit die. Generally, the purpose of an interposer 1300 is to spread a connection to a wider pitch or to reroute a connection to a different connection. For example, an interposer 1300 may couple an integrated circuit die to a ball grid array (BGA) 1306 that can subsequently be coupled to the second substrate 1304. In some embodiments, the first and second substrates 1302/1304 are attached to opposing sides of the interposer 1300. In other embodiments, the first and second substrates 1302/1304 are attached to the same side of the interposer 1300. And in further embodiments, three or more substrates are interconnected by way of the interposer 1300.

The interposer 1300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1308 and vias 1310, including but not limited to through-silicon vias (TSVs) 1312. The interposer 1300 may further include embedded devices 1314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1300.

In accordance with embodiments of the disclosure, apparatuses or processes disclosed herein may be used in the fabrication of interposer 1300.

Figure 14:
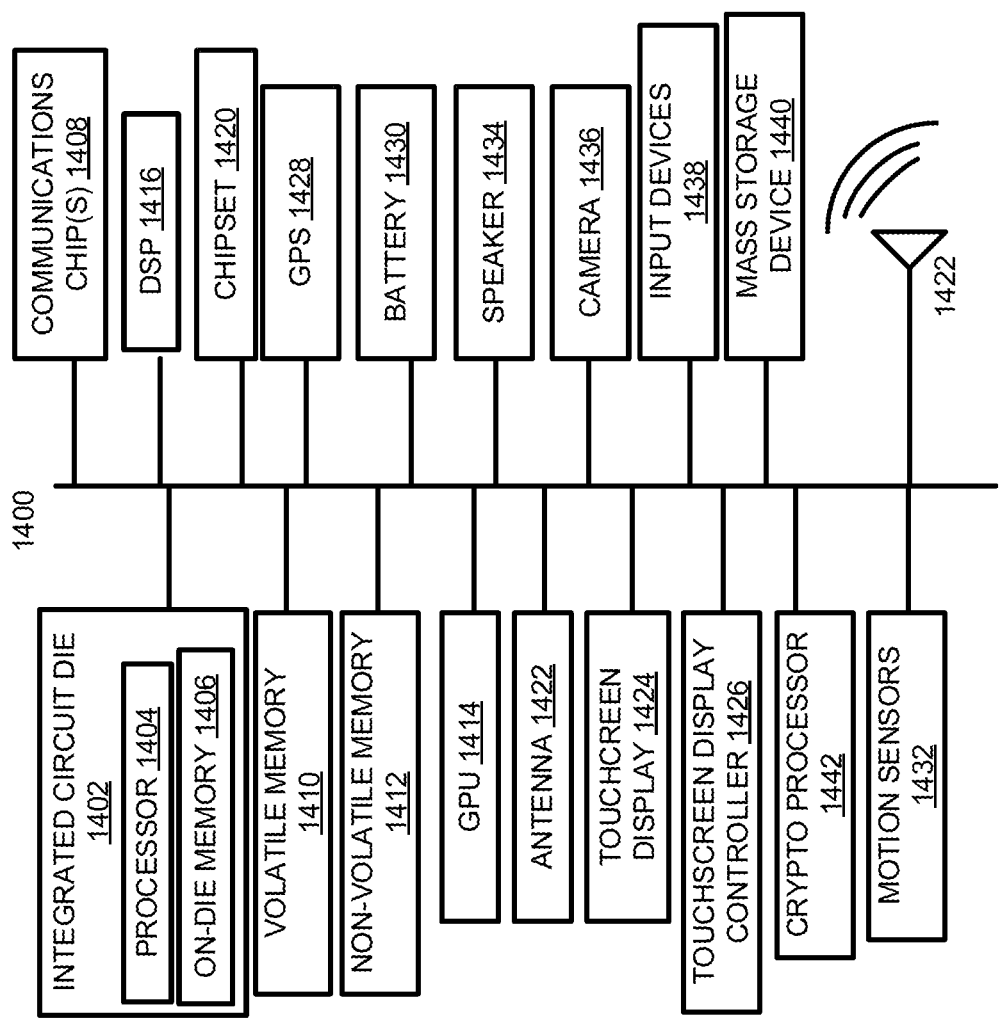
FIG. 14 schematically illustrates a computing device built in accordance with an embodiment of the disclosure, in accordance with some embodiments.

FIG. 14 illustrates a computing device 1400 in accordance with one embodiment of the disclosure. The computing device 1400 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 1400 include, but are not limited to, an integrated circuit die 1402 and at least one communications logic unit 1408. In some implementations the communications logic unit 1408 is fabricated within the integrated circuit die 1402 while in other implementations the communications logic unit 1408 is fabricated in a separate integrated circuit chip that may be bonded to a substrate or motherboard that is shared with or electronically coupled to the integrated circuit die 1402. The integrated circuit die 1402 may include a processor 1404 as well as on-die memory 1406, often used as cache memory, which can be provided by technologies such as embedded DRAM (eDRAM), or SRAM. For example, the on-die memory 1406 may include the TFT 100 shown in FIG. 1, the TFT 200 shown in FIG. 2, the TFT 300 shown in FIG. 3, the TFT 1200 shown in FIG. 12, or a TFT formed according to the process 400 shown in FIG. 4.

In embodiments, the computing device 1400 may include a display or a touchscreen display 1424, and a touchscreen display controller 1426. A display or the touchscreen display 1424 may include a FPD, an AMOLED display, a TFT LCD, a micro light-emitting diode (μLED) display, or others. For example, the touchscreen display 1424 may include the TFT 100 shown in FIG. 1, the TFT 200 shown in FIG. 2, the TFT 300 shown in FIG. 3, the TFT 1200 shown in FIG. 12, or a TFT formed according to the process 400 shown in FIG. 4.

Computing device 1400 may include other components that may or may not be physically and electrically coupled to the motherboard or fabricated within a SoC die. These other components include, but are not limited to, volatile memory 1410 (e.g., dynamic random access memory (DRAM), non-volatile memory 1412 (e.g., ROM or flash memory), a graphics processing unit 1414 (GPU), a digital signal processor (DSP) 1416, a crypto processor 1442 (e.g., a specialized processor that executes cryptographic algorithms within hardware), a chipset 1420, at least one antenna 1422 (in some implementations two or more antenna may be used), a battery 1430 or other power source, a power amplifier (not shown), a voltage regulator (not shown), a global positioning system (GPS) device 1428, a compass, a motion coprocessor or sensors 1432 (that may include an accelerometer, a gyroscope, and a compass), a microphone (not shown), a speaker 1434, a camera 1436, user input devices 1438 (such as a keyboard, mouse, stylus, and touchpad), and a mass storage device 1440 (such as hard disk drive, compact disk (CD), digital versatile disk (DVD), and so forth). The computing device 1400 may incorporate further transmission, telecommunication, or radio functionality not already described herein. In some implementations, the computing device 1400 includes a radio that is used to communicate over a distance by modulating and radiating electromagnetic waves in air or space. In further implementations, the computing device 1400 includes a transmitter and a receiver (or a transceiver) that is used to communicate over a distance by modulating and radiating electromagnetic waves in air or space.

The communications logic unit 1408 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1408 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 1400 may include a plurality of communications logic units 1408. For instance, a first communications logic unit 1408 may be dedicated to shorter range wireless communications such as Wi-Fi, NFC, and Bluetooth and a second communications logic unit 1408 may be dedicated to longer range wireless communications such as GPS, EDGE, GPRS, CDMA, WiMAX, LTE, Ev-DO, and others.

The processor 1404 of the computing device 1400 includes one or more devices, such as transistors. The term "processor" may refer to any device or portion of a device that processes electronic data from registers and/or memory to transform that electronic data into other electronic data that may be stored in registers and/or memory. The communications logic unit 1408 may also include one or more devices, such as transistors.

In further embodiments, another component housed within the computing device 1400 may contain one or more devices, such as DRAM, that are formed in accordance with implementations of the current disclosure, e.g., the TFT 100 shown in FIG. 1, the TFT 200 shown in FIG. 2, the TFT 300 shown in FIG. 3, the TFT 1200 shown in FIG. 12, or a TFT formed according to the process 400 shown in FIG. 4.

In various embodiments, the computing device 1400 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1400 may be any other electronic device that processes data.

Some Non-Limiting Examples are Provided Below.

Example 1 may include a semiconductor device, comprising: a substrate; a U-shaped channel above the substrate, wherein the U-shaped channel includes a channel bottom, a first channel wall and a second channel wall parallel to each other, a source area, and a drain area, the first channel wall intersects with the channel bottom at a first end and intersects with the source area at a second end, and the second channel wall intersects with the channel bottom at a first end and intersects with the drain area at a second end; a gate dielectric layer above the substrate and in contact with the channel bottom; a gate electrode above the substrate and in contact with the gate dielectric layer; and a source electrode coupled to the source area, and a drain electrode coupled to the drain area.

Example 2 may include the semiconductor device of example 1 and/or some other examples herein, further comprising: a first spacer next to the first channel wall, the source area, and the source electrode; and a second spacer next to the second channel wall, the drain area, and the drain electrode.

Example 3 may include the semiconductor device of any one of examples 1-2 and/or some other examples herein, wherein the gate electrode is a bottom gate electrode between the substrate and the channel bottom, the gate dielectric layer is between the gate electrode and the channel bottom, and the semiconductor device further includes a passivation layer between the first channel wall and the second channel wall.

Example 4 may include the semiconductor device of any one of examples 1-2 and/or some other examples herein, wherein the gate electrode is a top gate electrode above the channel bottom, and between the first channel wall and the second channel wall, and the gate dielectric layer is above the channel bottom, separating the first channel wall and the second channel from the gate electrode.

Example 5 may include the semiconductor device of any one of examples 1-2 and/or some other examples herein, wherein the gate electrode is a first gate electrode, and the semiconductor device further includes a second gate electrode, the first gate electrode is between the substrate and the channel bottom, and the second gate electrode is above the channel bottom, between the first channel wall and the second channel wall.

Example 6 may include the semiconductor device of any one of examples 1-2 and/or some other examples herein, wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

Example 7 may include the semiconductor device of any one of examples 1-2 and/or some other examples herein, wherein the U-shaped channel includes amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC).

Example 8 may include the semiconductor device of any one of examples 1-2 and/or some other examples herein, wherein the gate electrode includes titanium (Ti), molybdenum (Mo), gold (Au), platinum (Pt), aluminum (Al), nickel (Ni), copper (Cu), chromium (Cr), or an alloy of Ti, Mo, Au, Pt, Al Ni, Cu, Cr, TiAlN, HfAlN, or InAlO.

Example 9 may include the semiconductor device of any one of examples 1-2 and/or some other examples herein, wherein the substrate includes a silicon substrate, a glass substrate, a metal substrate, or a plastic substrate.

Example 10 may include the semiconductor device of any one of examples 1-2 and/or some other examples herein, wherein the semiconductor device is above an interconnect, and the interconnect is above the substrate.

Example 11 may include a method for forming a semiconductor device, the method comprising: forming a U-shaped channel above a substrate, wherein the U-shaped channel includes a channel bottom, a first channel wall and a second channel wall parallel to each other, a source area, and a drain area, the first channel wall intersects with the channel bottom at a first end and intersects with the source area at a second end, and the second channel wall intersects with the channel bottom at a first end and intersects with the drain area at a second end; forming a spacer conformally covering the first channel wall, the second channel wall, and the channel bottom; forming a dummy oxide within a void next to the spacer; removing a part of the source area and a part of the drain area aligned with the dummy oxide and the spacer; and forming a source electrode next to the source area, and a drain electrode next to the drain area.

Example 12 may include the method of example 11 and/or some other examples herein, further comprising: removing the dummy oxide; removing a part of the spacer next to the channel bottom to expose the channel bottom and to form a first spacer and a second spacer.

Example 13 may include the method of example 12 and/or some other examples herein, further comprising: forming a passivation layer between the first spacer, the second spacer, and in contact with the channel bottom.

Example 14 may include the method of example 12 and/or some other examples herein, further comprising: forming a gate dielectric layer conformally covering the channel bottom, the first spacer, and the second spacer; and forming a gate electrode within a void formed by the gate dielectric layer.

Example 15 may include the method of any one of examples 11-14 and/or some other examples herein, further comprising: forming a gate electrode above the substrate, before forming the U-shaped channel; and forming a gate dielectric layer above the gate electrode before forming the U-shaped channel.

Example 16 may include the method of example 15 and/or some other examples herein, wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

Example 17 may include the method of any one of examples 11-14 and/or some other examples herein, wherein the U-shaped channel includes amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC).

Example 18 may include the method of any one of examples 11-14 and/or some other examples herein, wherein the source electrode or the drain electrode includes titanium (Ti), molybdenum (Mo), gold (Au), platinum (Pt), aluminum (Al), nickel (Ni), copper (Cu), chromium (Cr), or an alloy of Ti, Mo, Au, Pt, Al Ni, Cu, Cr, TiAlN, HfAlN, or InAlO.

Example 19 may include the method of any one of examples 11-14 and/or some other examples herein, wherein the substrate includes a silicon substrate, a glass substrate, a metal substrate, or a plastic substrate.

Example 20 may include a computing device comprising: a processor; a memory device coupled to the processor, wherein the processor or the memory device includes a transistor, and the transistor includes: a U-shaped channel above a substrate, wherein the U-shaped channel includes a channel bottom, a first channel wall and a second channel wall parallel to each other, a source area, and a drain area, the first channel wall intersects with the channel bottom at a first end and intersects with the source area at a second end, and the second channel wall intersects with the channel bottom at a first end and intersects with the drain area at a second end; a gate dielectric layer in contact with the channel bottom; a gate electrode in contact with the gate dielectric layer; and a source electrode coupled to the source area, and a drain electrode coupled to the drain area.

Example 21 may include the computing device of example 20 and/or some other examples herein, further comprising: a first spacer next to the first channel wall, the source area, and the source electrode; and a second spacer next to the second channel wall, the drain area, and the drain electrode.

Example 22 may include the computing device of any one of examples 20-21 and/or some other examples herein, wherein the gate electrode is a bottom gate electrode between the substrate and the channel bottom, the gate dielectric layer is between the gate electrode and the channel bottom, and the semiconductor device further includes a passivation layer between the first channel wall and the second channel wall.

Example 23 may include the computing device of any one of examples 20-21 and/or some other examples herein, wherein the gate electrode is a top gate electrode above the channel bottom, and between the first channel wall and the second channel wall, and the gate dielectric layer is above the channel bottom, separating the first channel wall and the second channel from the gate electrode.

Example 24 may include the computing device of any one of examples 20-21 and/or some other examples herein, wherein the gate electrode is a first gate electrode, and the semiconductor device further includes a second gate electrode, the first gate electrode is between the substrate and the channel bottom, and the second gate electrode is above the channel bottom, between the first channel wall and the second channel wall.

Example 25 may include the computing device of any one of examples 20-21 and/or some other examples herein, wherein the computing device is a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Example 26 may include one or more computer-readable media having instructions for a computer device to form a semiconductor device, upon execution of the instructions by one or more processors, to perform the method of any one of examples 11-19.

Example 27 may include an apparatus for forming a semiconductor device, comprising: means for forming a U-shaped channel above a substrate, wherein the U-shaped channel includes a channel bottom, a first channel wall and a second channel wall parallel to each other, a source area, and a drain area, the first channel wall intersects with the channel bottom at a first end and intersects with the source area at a second end, and the second channel wall intersects with the channel bottom at a first end and intersects with the drain area at a second end; means for forming a spacer conformally covering the first channel wall, the second channel wall, and the channel bottom; means for forming a dummy oxide within a void next to the spacer; means for removing a part of the source area and a part of the drain area aligned with the dummy oxide and the spacer; and means for forming a source electrode next to the source area, and a drain electrode next to the drain area.

Example 28 may include the apparatus of example 27 and/or some other examples herein, further comprising: means for removing the dummy oxide; means for removing a part of the spacer next to the channel bottom to expose the channel bottom and to form a first spacer and a second spacer.

Example 29 may include the apparatus of example 28 and/or some other examples herein, further comprising: means for forming a passivation layer between the first spacer, the second spacer, and in contact with the channel bottom.

Example 30 may include the apparatus of example 28 and/or some other examples herein, further comprising: means for forming a gate dielectric layer conformally covering the channel bottom, the first spacer, and the second spacer; and means for forming a gate electrode within a void formed by the gate dielectric layer.

Example 31 may include the apparatus of any one of examples 27-30 and/or some other examples herein, further comprising: means for forming a gate electrode above the substrate, before forming the U-shaped channel; and means for forming a gate dielectric layer above the gate electrode before forming the U-shaped channel.

Example 32 may include the apparatus of example 31 and/or some other examples herein, wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

Example 33 may include the apparatus of any one of examples 27-30 and/or some other examples herein, wherein the U-shaped channel includes amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC).

Example 34 may include the apparatus of any one of examples 27-30 and/or some other examples herein, wherein the source electrode or the drain electrode includes titanium (Ti), molybdenum (Mo), gold (Au), platinum (Pt), aluminum (Al), nickel (Ni), copper (Cu), chromium (Cr), or an alloy of Ti, Mo, Au, Pt, Al Ni, Cu, Cr, TiAlN, HfAlN, or InAlO.

Example 35 may include the apparatus of any one of examples 27-30 and/or some other examples herein, wherein the substrate includes a silicon substrate, a glass substrate, a metal substrate, or a plastic substrate.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a substrate;
   a U-shaped channel above the substrate, wherein the U-shaped channel includes a channel bottom, a first channel wall and a second channel wall parallel to each other, a source area, and a drain area, the first channel wall intersects with the channel bottom at a first end and intersects with the source area at a second end, and the second channel wall intersects with the channel bottom at a first end and intersects with the drain area at a second end;
   a gate dielectric layer above the substrate and in contact with the channel bottom;
   a gate electrode above the substrate and in contact with the gate dielectric layer, wherein the gate electrode extends laterally beyond a lowermost portion of an outermost side of the first channel wall and laterally beyond a lowermost portion of an outermost side of the second channel wall of the U-shaped channel; and
   a source electrode in direct physical contact with a top surface of the source area but not in direct physical contact with a bottom surface of the source area, and a drain electrode in direct physical contact with a top surface of the drain area but not in direct physical contact with a bottom surface of the drain area, wherein a bottommost surface of the source electrode is above an uppermost surface of the source area, and a bottommost surface of the drain electrode is above an uppermost surface of the drain area, and wherein the source electrode is entirely within a width of the source area along a direction from the source area to the drain area and is vertically overlapping with the first channel wall of the U-shaped channel structure, and the drain electrode is entirely within a width of the drain area along the direction from the source area to the drain area and is vertically overlapping with the second channel wall of the U-shaped channel structure.

2. The semiconductor device of claim 1, further comprising:
   a first spacer next to the first channel wall, the source area, and the source electrode; and
   a second spacer next to the second channel wall, the drain area, and the drain electrode.

3. The semiconductor device of claim 1, wherein the gate electrode is a bottom gate electrode between the substrate and the channel bottom, the gate dielectric layer is between the gate electrode and the channel bottom, and the semiconductor device further includes a passivation layer between the first channel wall and the second channel wall.

4. The semiconductor device of claim 1, wherein the gate electrode is a top gate electrode above the channel bottom, and between the first channel wall and the second channel wall, and the gate dielectric layer is above the channel bottom, separating the first channel wall and the second channel from the gate electrode.

5. The semiconductor device of claim 1, wherein the gate electrode is a first gate electrode, and the semiconductor device further includes a second gate electrode, the first gate electrode is between the substrate and the channel bottom, and the second gate electrode is above the channel bottom, between the first channel wall and the second channel wall.

6. The semiconductor device of claim 1, wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

7. The semiconductor device of claim 1, wherein the U-shaped channel includes amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC).

8. The semiconductor device of claim 1, wherein the gate electrode includes titanium (Ti), molybdenum (Mo), gold (Au), platinum (Pt), aluminum (Al), nickel (Ni), copper (Cu), chromium (Cr), or an alloy of Ti, Mo, Au, Pt, Al Ni, Cu, Cr, TiAlN, HfAlN, or InAlO.

9. The semiconductor device of claim 1, wherein the substrate includes a silicon substrate, a glass substrate, a metal substrate, or a plastic substrate.

10. The semiconductor device of claim 1, wherein the semiconductor device is above an interconnect, and the interconnect is above the substrate.

11. A computing device comprising:
    a processor;
    a memory device coupled to the processor, wherein the processor or the memory device includes a transistor, and the transistor includes:
        a U-shaped channel above a substrate, wherein the U-shaped channel includes a channel bottom, a first channel wall and a second channel wall parallel to each other, a source area, and a drain area, the first channel wall intersects with the channel bottom at a first end and intersects with the source area at a second end, and the second channel wall intersects with the channel bottom at a first end and intersects with the drain area at a second end;

a gate dielectric layer in contact with the channel bottom;

a gate electrode in contact with the gate dielectric layer, wherein the gate electrode extends laterally beyond a lowermost portion of an outermost side of the first channel wall and laterally beyond a lowermost portion of an outermost side of the second channel wall of the U-shaped channel; and a source electrode in direct physical contact with a top surface of the source area but not in direct physical contact with a bottom surface of the source area, and a drain electrode in direct physical contact with a top surface of the drain area but not in direct physical contact with a bottom surface of the drain area, wherein a bottommost surface of the source electrode is above an uppermost surface of the source area, and a bottommost surface of the drain electrode is above an uppermost surface of the drain area, and wherein the source electrode is entirely within a width of the source area along a direction from the source area to the drain area and is vertically overlapping with the first channel wall of the U-shaped channel structure, and the drain electrode is entirely within a width of the drain area along the direction from the source area to the drain area and is vertically overlapping with the second channel wall of the U-shaped channel structure.

12. The computing device of claim 11, further comprising:

a first spacer next to the first channel wall, the source area, and the source electrode; and a second spacer next to the second channel wall, the drain area, and the drain electrode.

13. The computing device of claim 11, wherein the gate electrode is a bottom gate electrode between the substrate and the channel bottom, the gate dielectric layer is between the gate electrode and the channel bottom, and the semiconductor device further includes a passivation layer between the first channel wall and the second channel wall.

14. The computing device of claim 11, wherein the gate electrode is a top gate electrode above the channel bottom, and between the first channel wall and the second channel wall, and the gate dielectric layer is above the channel bottom, separating the first channel wall and the second channel from the gate electrode.

15. The computing device of claim 11, wherein the gate electrode is a first gate electrode, and the semiconductor device further includes a second gate electrode, the first gate electrode is between the substrate and the channel bottom, and the second gate electrode is above the channel bottom, between the first channel wall and the second channel wall.

16. The computing device of claim 11, wherein the computing device is a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, or a camera.

* * * * *